United States Patent
Leung et al.

(10) Patent No.: US 8,030,208 B2
(45) Date of Patent: Oct. 4, 2011

(54) BONDING METHOD FOR THROUGH-SILICON-VIA BASED 3D WAFER STACKING

(75) Inventors: Chi Kuen Vincent Leung, Tin Shui Wai (HK); Peng Sun, Fanling (HK); Xunqing Shi, Fanling (HK); Chang Hwa Chung, Shatin (HK)

(73) Assignee: Hong Kong Applied Science and Technology Research Institute Company Limited, Shatin, New Territories (HK)

( * ) Notice: Subject to any disclaimer, the term of this patent is extended or adjusted under 35 U.S.C. 154(b) by 433 days.

(21) Appl. No.: 12/131,777

(22) Filed: Jun. 2, 2008

(65) Prior Publication Data

US 2009/0294974 A1    Dec. 3, 2009

(51) Int. Cl.
*H01L 21/4763*   (2006.01)

(52) U.S. Cl. ......... 438/637; 438/624; 438/667; 438/668

(58) Field of Classification Search .................. 438/108, 438/109, 455, 458, 459, 624, 637, 667, 668
See application file for complete search history.

(56) References Cited

U.S. PATENT DOCUMENTS

| | | | |
|---|---|---|---|
| 4,897,708 A | 1/1990 | Clements | |
| 5,128,831 A | 7/1992 | Fox, III et al. | |
| 5,270,261 A * | 12/1993 | Bertin et al. | 438/109 |
| 6,448,661 B1 | 9/2002 | Kim et al. | |
| 6,566,232 B1 * | 5/2003 | Hara et al. | 438/455 |
| 6,577,013 B1 | 6/2003 | Glenn et al. | |
| 6,593,645 B2 | 7/2003 | Shih et al. | |
| 6,706,555 B2 | 3/2004 | Brand | |
| 6,933,172 B2 | 8/2005 | Tomimatsu | |
| 7,157,787 B2 | 1/2007 | Kim et al. | |
| 7,291,922 B2 | 11/2007 | Yoshioka et al. | |
| 7,749,899 B2 * | 7/2010 | Clark et al. | 438/667 |
| 7,838,967 B2 * | 11/2010 | Chen | 257/621 |
| 2002/0192861 A1 | 12/2002 | Brand | |
| 2006/0038288 A1 | 2/2006 | Yoshioka et al. | |
| 2007/0007641 A1 | 1/2007 | Lee et al. | |
| 2007/0218678 A1 | 9/2007 | Suh et al. | |
| 2008/0029850 A1 * | 2/2008 | Hedler et al. | 257/621 |

FOREIGN PATENT DOCUMENTS

| | | |
|---|---|---|
| CN | 1893053 A | 1/2007 |
| CN | 101038883 A | 9/2007 |
| JP | 2002-270714 A | 9/2002 |
| JP | 2005-175336 A | 6/2005 |

OTHER PUBLICATIONS

PCT/CN2008/071203; filed Jun. 5, 2008; Search Report mailed Nov. 27, 2008; 5 pp.
PCT/CN2008/071203; filed Jun. 5, 2008; Written Opinion mailed Nov. 27, 2008; 7 pp.

* cited by examiner

*Primary Examiner* — Kevin M Picardat
(74) *Attorney, Agent, or Firm* — Wells St. John, P.S.

(57) ABSTRACT

There is described a bonding method for through-silicon-via bonding of a wafer stack in which the wafers are formed with through-silicon-vias and lateral microchannels that are filled with solder. To fill the vias and channels the wafer stack is placed in a soldering chamber and molten solder is drawn through the vias and channels by vacuum. The wafers are held together by layers of adhesive during the assembly of the wafer stack. Means are provided for local reheating of the solder after it has cooled to soften the solder to enable it to be removed from the soldering chamber.

11 Claims, 12 Drawing Sheets

BONDING METHOD FOR THROUGH-SILICON-VIA BASED 3D WAFER STACKING

FIELD OF THE INVENTION

This invention relates to a bonding method for through-silicon-via based 3D wafer stacking. The invention relates to methods for forming a wafer stack and to the wafer stack.

BACKGROUND OF THE INVENTION

With electronic devices, particularly portable devices such as mobile phones, becoming smaller and yet at the same time offering a wider range of functions, there is a need to integrate multifunctional chips but without increasing the size of the devices and keeping a small form factor. Increasing the number of electronic components in a 2D structure is incompatible with these objectives, and therefore 3D packages are increasingly being adopted in order to provide greater functionality and higher component density but with a small form factor.

In a 3D structure electronic components such as semiconductor chips may be provided in a multilayer stacked structure. To connect electrically the components in different layers through-silicon-via (TSV) technology may be used to provide the electrical interconnect and to provide mechanical support. In TSV technology a via is fabricated in a silicon chip and the via is filled with metal. Multiple components provided with such vias are then stacked and bonded together.

PRIOR ART

The bonding method is an important aspect of the fabrication of stacked electronic components. An ideal bonding method should be reliable and cost-effective. Traditionally wire bonding (eg U.S. Pat. No. 6,933,172) is used to establish electrical interconnect between chips, but wire-bonding requires greater in-plane size and is inconsistent with the objective of maximizing the component density. As an alternative to wire-bonding the use of TSV interconnects has been proposed, and methods including diffusion bonding, soldering and adhesive bonding can be used to bond wafers/chips with TSV interconnects. With each new component being added to the stack the soldering process causes the potential of failure of previously created solder joints that undermines their reliability.

In diffusion bonding a thin metal bonding layer (formed for example preferably from copper but also possibly tin, indium, gold, nickel, silver, palladium, palladium-nickel alloy or titanium) is applied to the respective surface of semiconductor components that are to be bonded. When the components are brought together under the correct conditions of temperature and pressure the two metal bonding layers diffuse into each other to form the bond. Diffusion bonding produces a good quality bond that is reliable, but disadvantages of this method include the requirement for very good coplanarity of the two semiconductor components and the need for a high bonding temperature. The method is therefore difficult to implement and is expensive. A typical example of a diffusion bonding method is shown in U.S. Pat. No. 7,157,787.

Adhesive bonding is a low cost option in which an adhesive layer is provided on the surfaces to be bonded together. An example of adhesive bonding is shown in U.S. Pat. No. 6,593,645. U.S. Pat. No. 6,448,661 shows an example of the prior art in which chips are bonded using conductive adhesives such as anisotropic conductive film (ACF) or anisotropic conductive adhesive (ACA). Another example of adhesive bonding is shown in U.S. Pat. No. 4,897,708 where wafers are bonded by adhesive and electrical connections are made by a conductive liquid. However, while adhesive bonding is low cost and does not present significant manufacturing problems, it provides a low bonding strength, is not suitable for high current use and is unreliable.

An example of a soldering method is shown in U.S. Pat. No. 6,577,013. In a soldering method solder is applied at the junctions of vias on semiconductor components to be stacked. Soldering does not require such high temperatures as diffusion bonding and can still produce a good reliable bond. However, soldering encounters problems as the number of components being stacked increases. With each new component being added to the stack the soldering process causes the potential of failure of previously created solder joints that undermines their reliability. In particular repeated reflow processes may cause the growth of intermetallic compounds at previously formed joints that lead to brittle joints that are more likely to fail.

Another problem with TSV-based 3D stacking methods is that the via filling step can introduce voids into the metal filling the vias which in turn can cause reliability issues.

SUMMARY OF THE INVENTION

According to the invention there is provided a method of forming a wafer stack comprising the steps of, assembling a plurality of wafers, wherein each said wafers is provided with at least one via and wherein a channel is provided at an interface between two wafers connecting a via formed in one of said two wafers with a via formed in the other of said wafers, placing said plurality of wafers in a soldering chamber, and applying a vacuum to a first of said wafers defining a first side of said wafer stack to draw molten solder from a second side of said wafers through said vias and channel until said vias and channel are filled with solder.

In preferred embodiments of the invention the soldering chamber is provided with a vacuum tunnel that connects to openings that correspond with the openings of the vias formed in the first wafer, and molten solder is drawn through the vias and channel until it extends into the openings in the soldering chamber.

Preferably, after the molten solder is drawn through the wafer stack the wafer stack is allowed to cool and a part of the stack (eg the solder joint at the top of the stack where it contacts the soldering chamber) is then locally re-heated to enable removal of the wafer stack from the soldering chamber.

The wafer stack is preferably formed on a wafer holder that is removed before placing the wafer stack in the soldering chamber. In particular, the wafer stack may be formed by the steps of (a) depositing a first layer of photoresist on a first wafer and then patterning a first surface of said first layer of photoresist to define vias to be formed in the first wafer, (b) etching openings in the first wafer corresponding to the vias but not extending all the way through the first layer, (c) forming a metal layer on the interior of the openings and on the surface of the first wafer surrounding the openings, (d) fixing the first wafer to a wafer holder such that the first surface of the first wafer faces the wafer holder and a second surface of the wafer faces away from the wafer holder, (e) grinding the second surface of the first wafer until the openings extend all the way through the first wafer and become vias, (f) applying a layer of adhesive to the second surface and patterning the layer of adhesive to remove adhesive at least in the regions of the vias, attaching to the layer of adhesive a second wafer on which the steps of (a) to (c) have been carried out and then carrying out steps (e) and (f) on the second wafer and then repeating steps (a) to (c) and (e) to (f) on subsequent wafers until the wafer stack is complete with step (f) being omitted on the final wafer.

Preferably in step (f) the adhesive layer is patterned to define a channel extending from a via in the first wafer to a via in the second wafer.

According to another aspect of the invention there is also provided a method of forming a wafer stack comprising the steps of (a) depositing a first layer of photoresist on a first wafer and then patterning a first surface of the first layer of photoresist to define vias to be formed in the first wafer, (b) etching openings in the first wafer corresponding to the vias but not extending all the way through the first layer, (c) forming a metal layer on the interior of the openings and on the surface of the first wafer surrounding the openings, (d) fixing the first wafer to a wafer holder such that the first surface of the first wafer faces the wafer holder and a second surface of the wafer faces away from the wafer holder, (e) grinding the second surface of the first wafer until the openings extend all the way through the first wafer and become vias, (f) applying a layer of adhesive to the second surface and patterning the layer of adhesive to remove adhesive at least in the regions of the vias, attaching to the layer of adhesive a second wafer on which the steps of (a) to (c) have been carried out and then carrying out steps (e) and (f) on the second wafer and then repeating steps (a) to (c) and (e) to (f) on subsequent wafers until the wafer stack is complete with step (f) being omitted on the final wafer.

Preferably in step (f) the adhesive layer is patterned to define a channel extending from a via in the first wafer to a via in the second wafer.

According to a still further aspect of the present invention there is also provided a method of filling vias in a wafer stack with solder comprising the steps of, placing the wafer stack in a soldering chamber at a first temperature, allowing molten solder to fill the vias in the wafer stack, allowing the wafer stack to cool such that the molten solder is allowed to cool and solidify, and then locally heating a part of the wafer stack to a second temperature lower than the first temperature to enable the wafer stack to be removed from the soldering chamber.

According to a still further aspect of the present invention there is provided a wafer stack comprising a plurality of wafers, at least one wafer being provided with at least one via extending therethrough, the wafer stack including at least one pair of adjacent wafers having vias that are laterally displaced relative to each other and the laterally displaced wafers being connected by a channel extending along an interface between the adjacent wafers. Preferably the vias and channel are filled with a solder material.

According to a still further aspect of the invention there is provided apparatus for filling vias in a wafer stack with solder comprising, a chamber for receiving a wafer stack, the chamber being formed with a first part that in use contacts a first surface of the wafer stack and a second part that in use contacts a second surface of the wafer stack, the first part being formed with openings that are coincident with vias that open to the first surface of the wafer stack and the second part being formed with openings that are coincident with vias that open to the second surface of the wafer stack, and wherein the first part of the apparatus is connected to a vacuum and the second part of the apparatus is connected to a source of solder. Preferably the apparatus is provided with means to control the temperature of said apparatus.

BRIEF DESCRIPTION OF THE DRAWINGS

Some embodiments of the invention will now be described by way of example and with reference to the accompanying figures, in which.

DETAILED DESCRIPTION OF PREFERRED EMBODIMENTS

There will now be described one embodiment of a process for the stacking of multiple wafers electrically-interconnected using TSVs in accordance with an embodiment of the invention.

Figure 1:
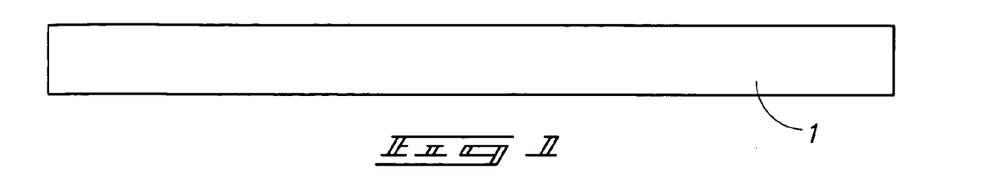
FIGS. 1 to 22 show in sequence one embodiment of a method for forming a wafer stack.
Figure 2:
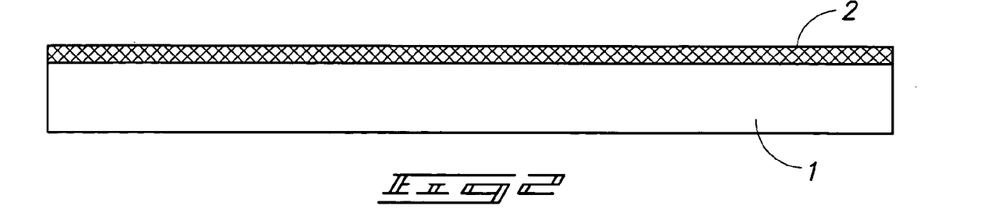
Figure 3:
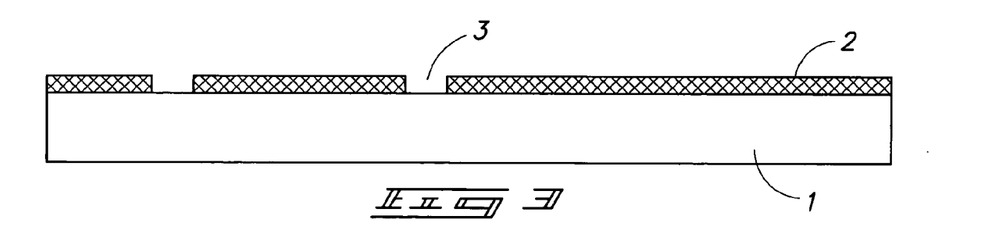
Figure 4:
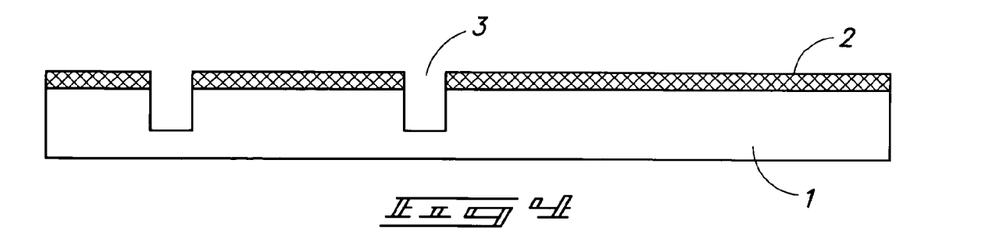
Figure 5:
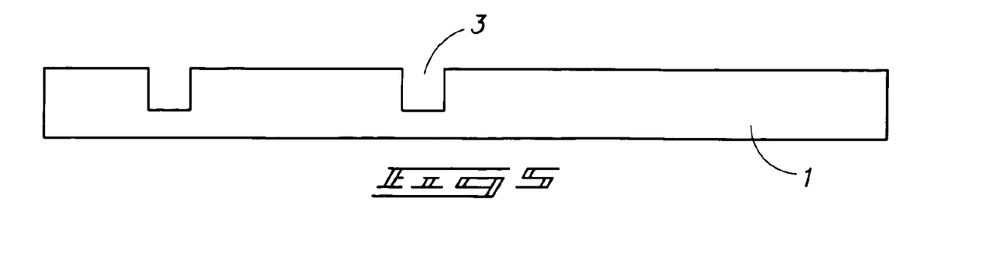

The starting point is a wafer 1 as shown in FIG. 1. The wafer 1 may be a silicon wafer and may have a thickness in the range of 100-500 µm. A layer of photoresist 2 is then applied to the upper surface of the wafer 1 by means of a spinning process (FIG. 2), and then the photoresist 2 is exposed to form a desired pattern (FIG. 3) including openings 3 that are then extended into the wafer 1 by a deep reactive-ion etching (DRIE) process (FIG. 4), and then the remaining photoresist is removed (FIG. 5).

Figure 6:
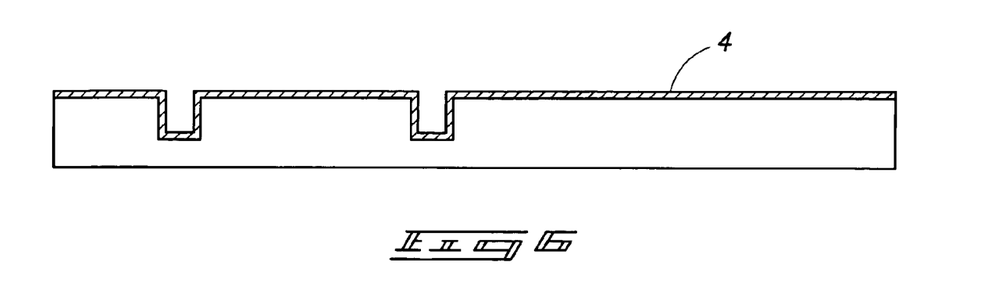

Following removal of the photoresist a metal plating step is performed (FIG. 6). Firstly a layer of $SiO_2$ is formed on the surface of the silicon wafer by a plasma-enhanced chemical vapour deposition process, and then layers 4 of Ti/W (to a depth of 0.1 µm-2 µm), and Cu (again to a depth of 0.1 µm-2 µm) are deposited in sequence.

Figure 7:
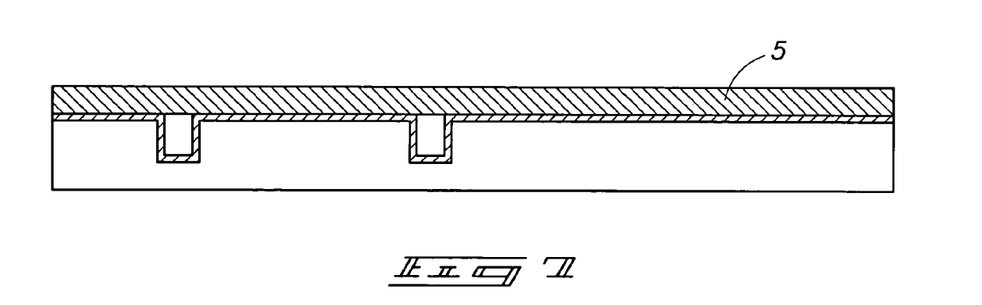
Figure 8:
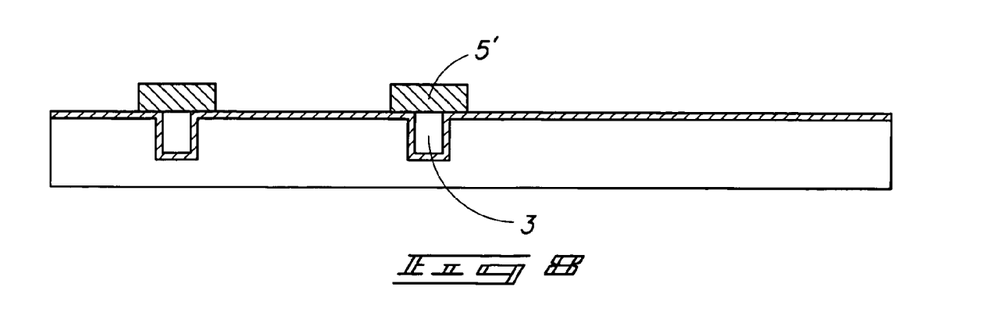
Figure 9:
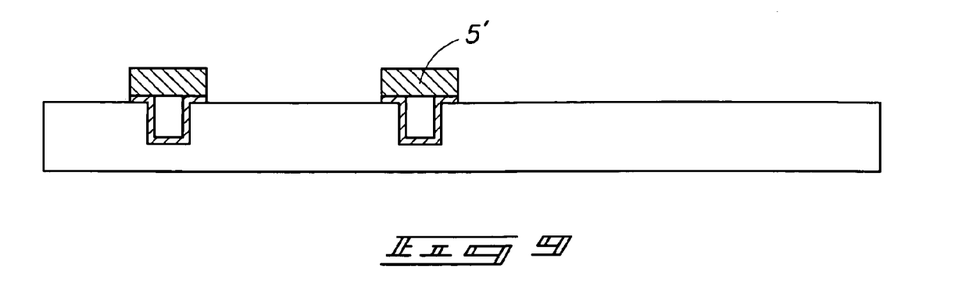
Figure 10:
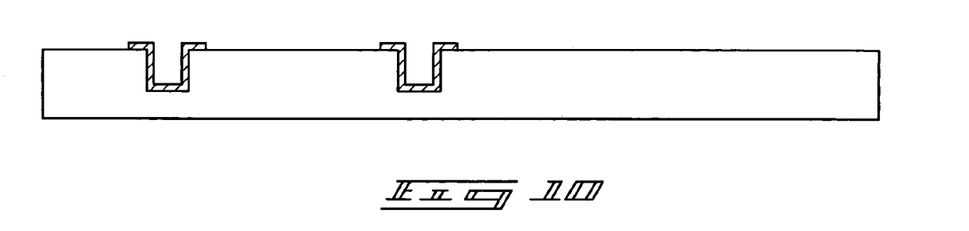

A layer of film-type photoresist 5 is then laminated on the top surface (FIG. 7), and then patterned so as to leave portions 5' covering the openings 3 (FIG. 8). The metal layer 4 that is not protected by the photoresist portions 5' is then etched away (FIG. 9), and then the remaining photoresist portions 5' are removed (FIG. 10) such that the metal layer 4 is left covering only the bottom and side walls of the openings 3, together with a region of the top surface of the wafer 1 surrounding the openings 3.

Figure 11:
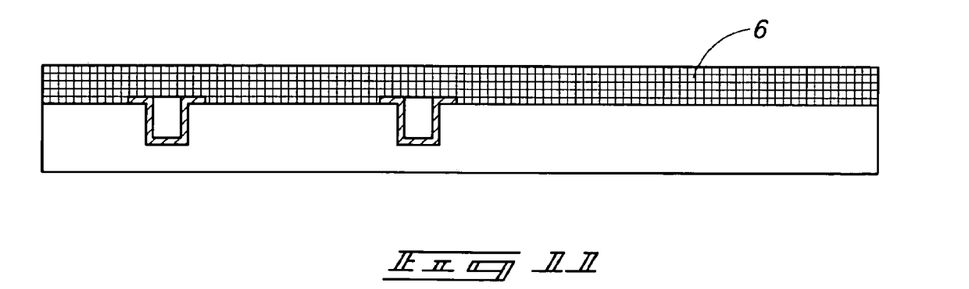
Figure 12:
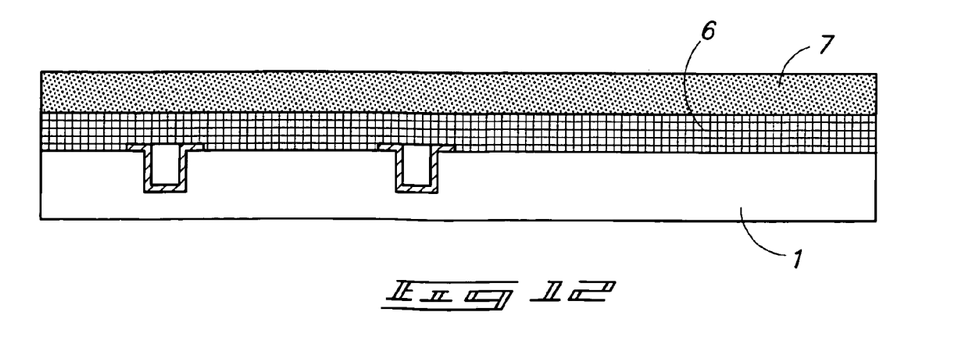
Figure 13:
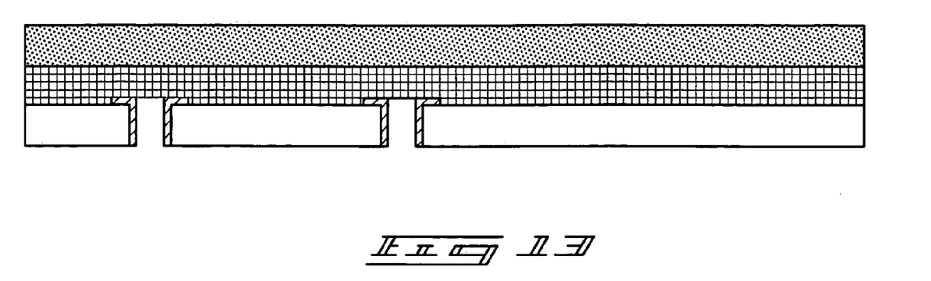
Figure 14:
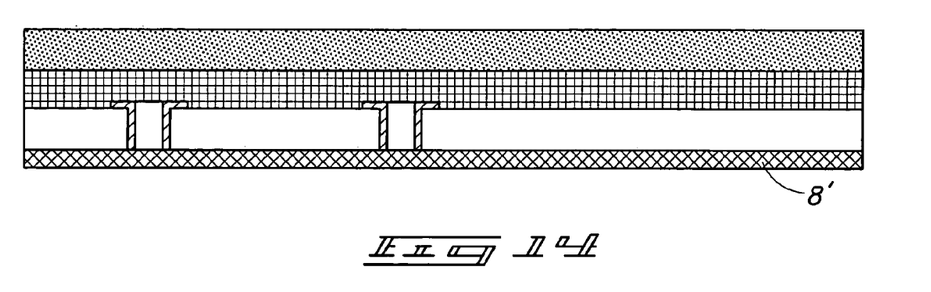
Figure 15:
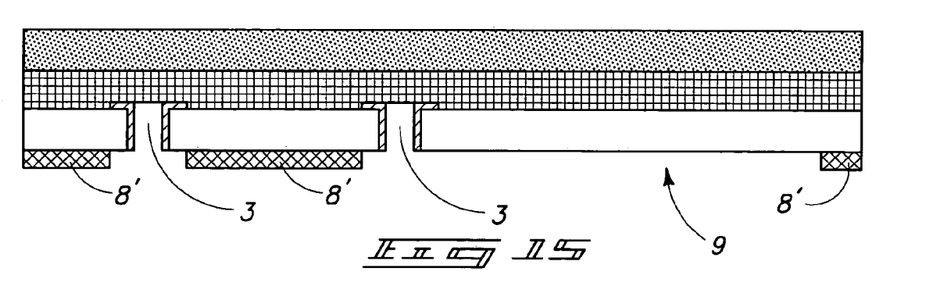
Figure 16:
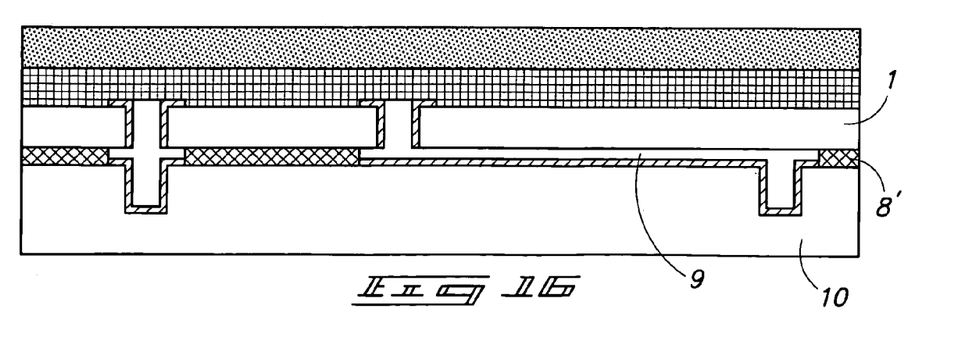

A mounting film 6 is then attached to the top surface of wafer 1 (FIG. 11), and a wafer holder 7 is then placed on top of the mounting film 6 (FIG. 12). With the wafer 1 secured on the wafer holder 7, a back grinding process involving grinding, chemical mechanical polishing (CMP) and etching is then carried out (FIG. 13) to reduce the thickness of the wafer 1 until the openings 3 extend all the way through the wafer 1 and become vias. A layer of film-type adhesive 8 is then applied to the back side of the wafer 1 (FIG. 14). The adhesive layer 8 is then patterned and areas of the adhesive layer 8 are removed using a laser (of any suitable type and power) (FIG. 15) so that the adhesive layer 8 is removed to expose the vias 3 leaving adhesive portions 8' and partially defining microchannels 9 where future electrical connections are to be made between different chips. A second wafer 10 constructed similarly but at a stage prior to the back-grinding is then attached to the underside of the initial wafer 1 by the remaining adhesive portions 8' (FIG. 16) such that the microchannels 9 are fully formed by a grinding, CMP and etching process. The advantage of stacking the wafers on a wafer holder is that this enables unlimited numbers of very thin wafers to be stacked while mitigating the problems that can occur with the handling of thin wafers.

Figure 17:
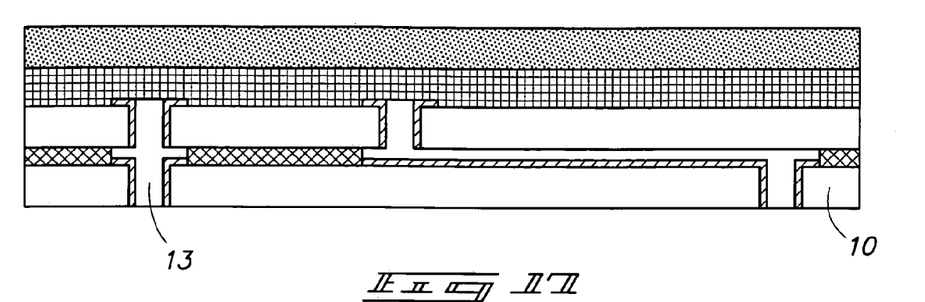
Figure 18:
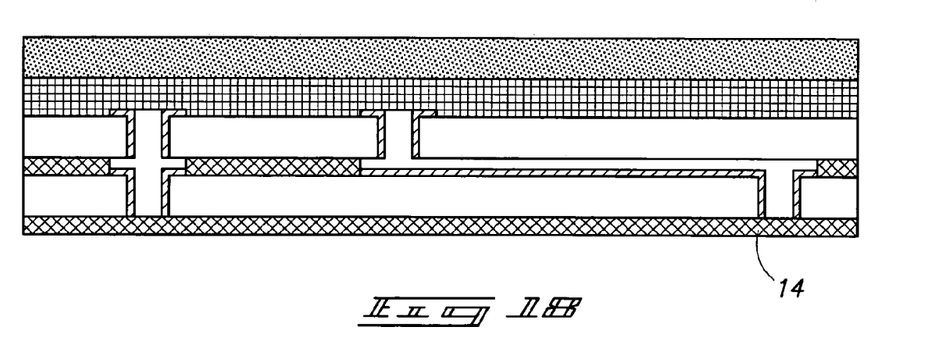
Figure 19:
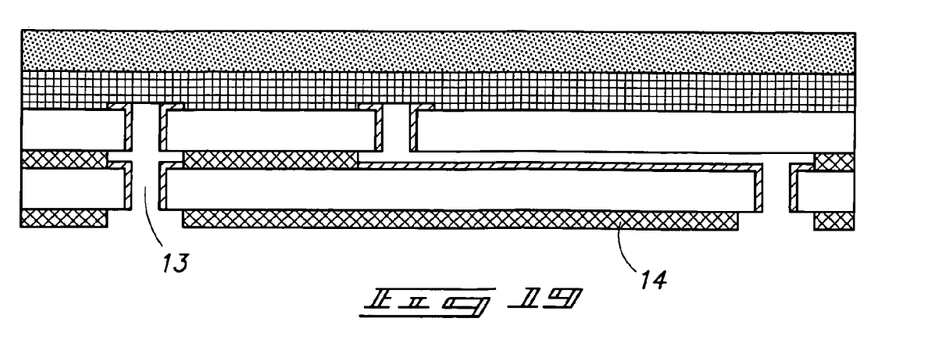
Figure 20:
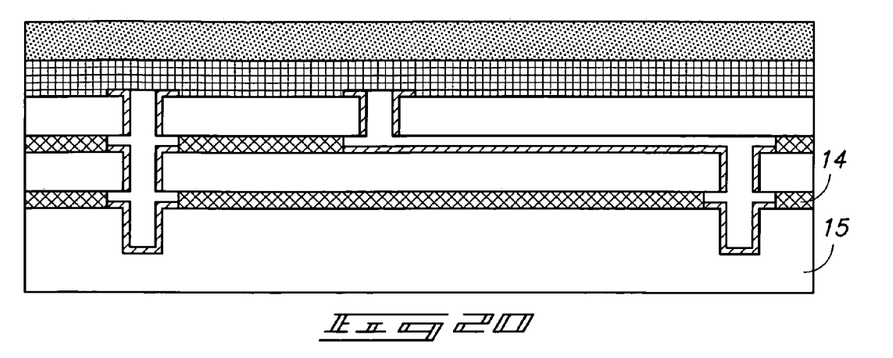
Figure 21:
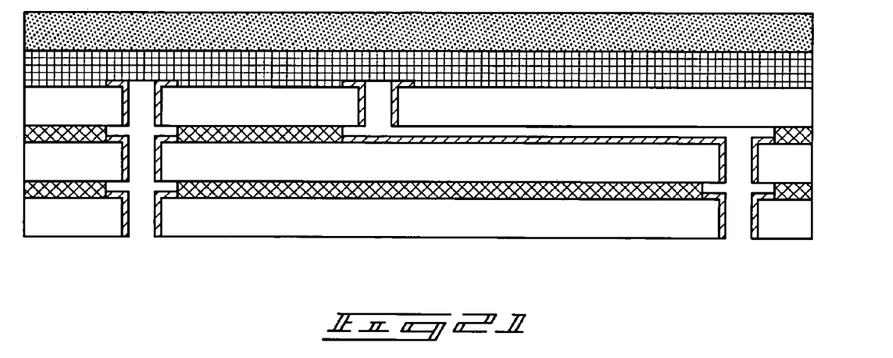
Figure 22:
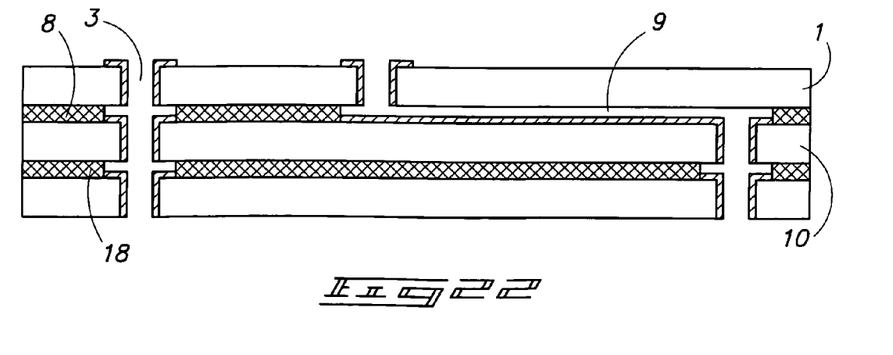

The second wafer 10 is then subject to back-grinding such that the openings in the second wafer extend all the way through the second wafer and become vias 13 (FIG. 17). Again a layer of adhesive film 14 is laminated to the exposed underside of the second layer 10 (FIG. 18) and is patterned to expose at least the vias 13 (FIG. 19). A third wafer 15 may then be attached to the underside of the second wafer by means of the adhesive film 14 (FIG. 20), and the back-grinding process is repeated to open the vias in the third wafer (FIG. 21), and then the mounting film and the wafer holder are removed (FIG. 22) leaving three wafers secured together by adhesive films and allowing electrical interconnections by vias 3 and microchannels 9.

It will of course be understood that this process can be repeated as often as required and in this example the use of three wafers is purely for explanatory purposes and more (or fewer) wafers can be provided as desired. The advantage of using the wafer holder is that is permits wafer level stacking, this wafer stacking then enables high-throughput.

Figure 23:
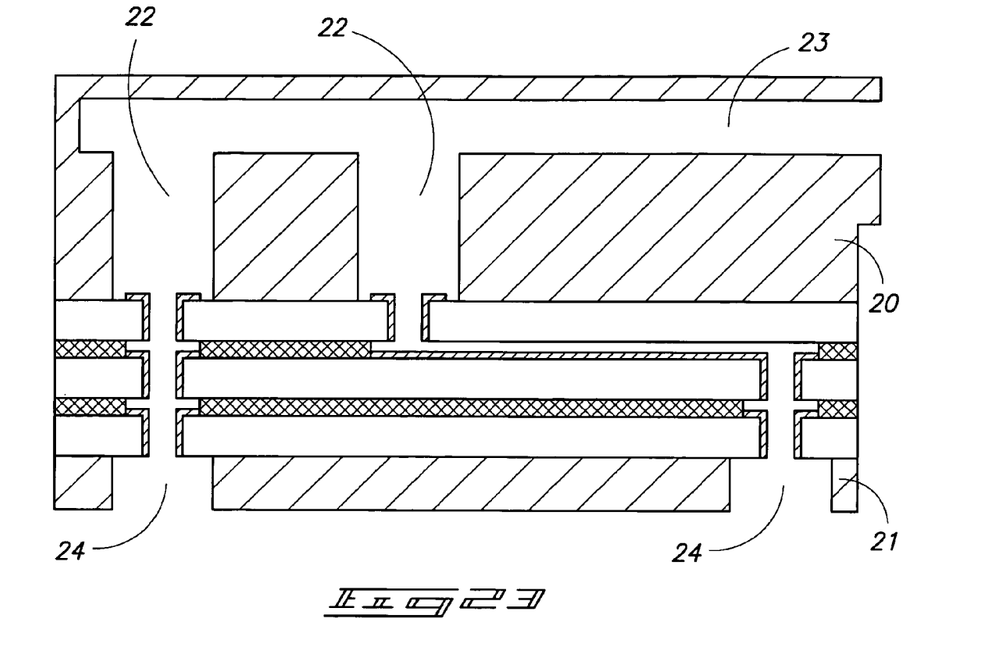
FIG. 23 is a sectional view showing the wafer stack placed in a soldering chamber according to an embodiment of the invention.
Figure 24:
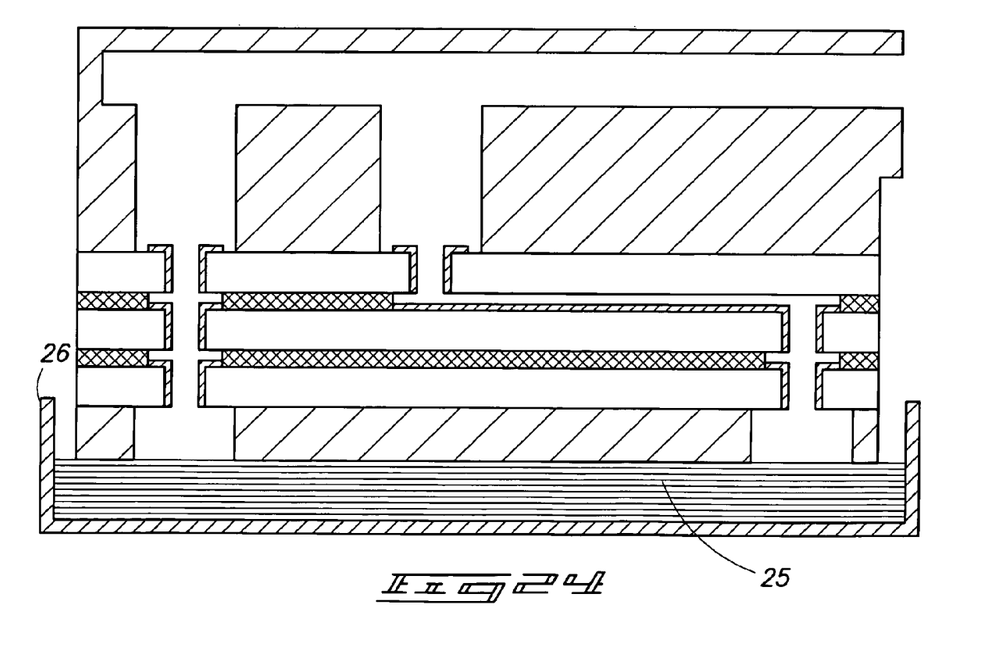
FIG. 24 shows the provision of a solder pool for use in the soldering process in an embodiment of the invention.
Figure 25:
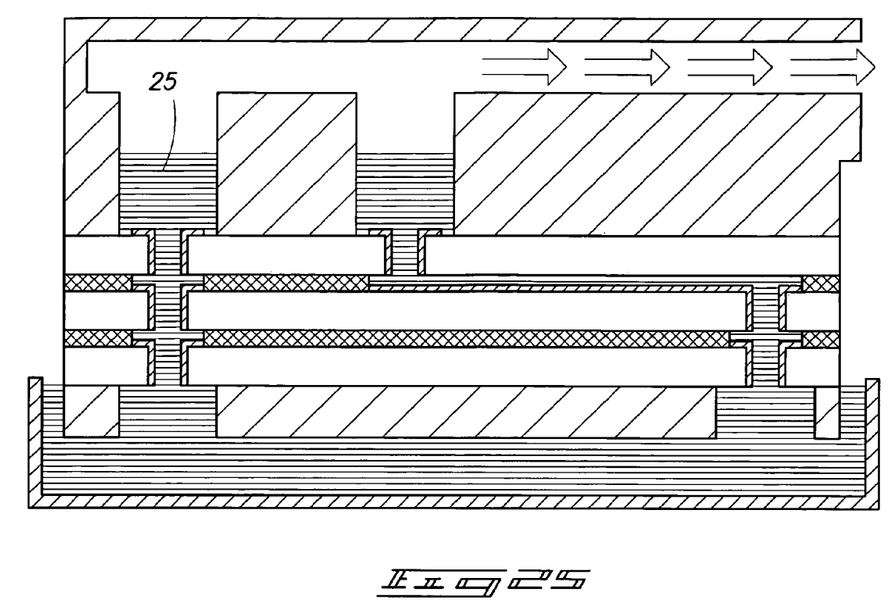
FIG. 25 shows the effect of applying vacuum to the soldering chamber drawing solder through the wafer stack.
Figure 26:
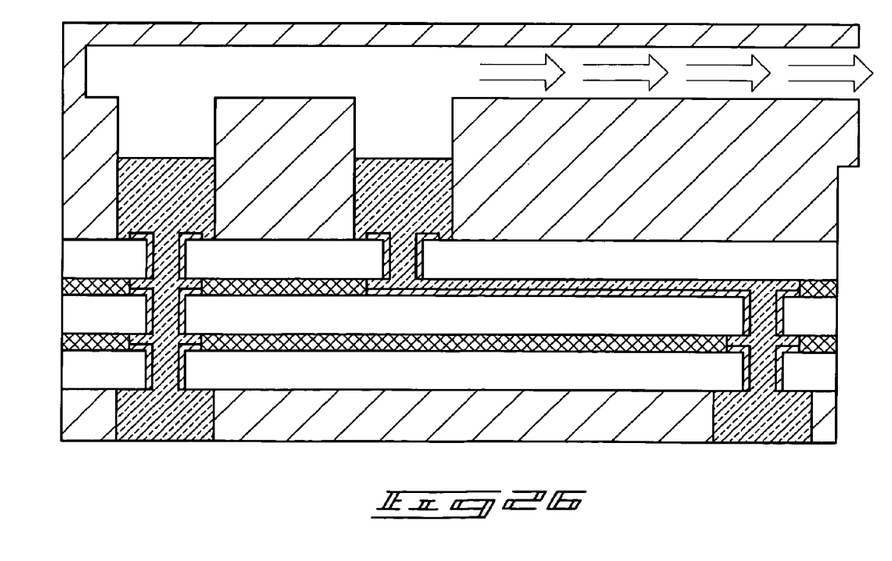
FIG. 26 shows the soldering chamber according to an embodiment of the invention with the vias and microchannels filled with solder and the solder pool removed.
Figure 27:
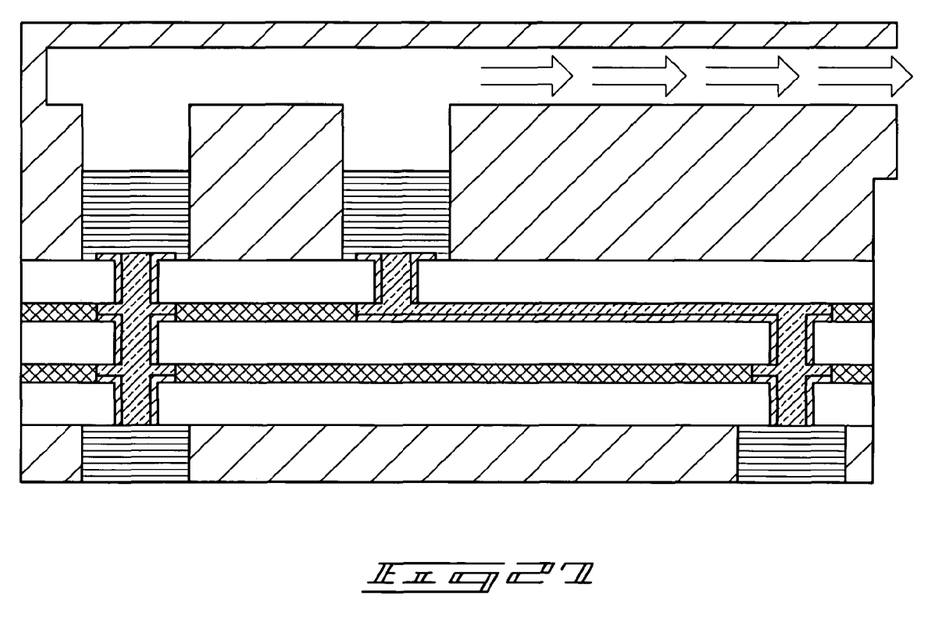
FIG. 27 shows the re-heating of the soldering chamber to enable removal of the wafer stack.
Figure 28:
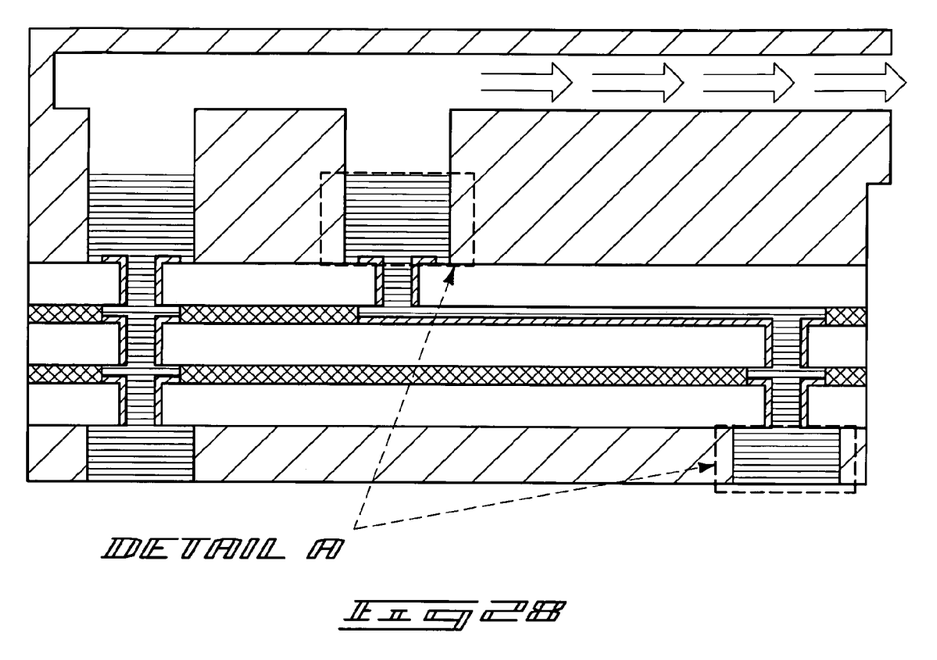
FIG. 28 shows in detail the localaised reheating that enables removal of the wafer stack.
Figure 29:
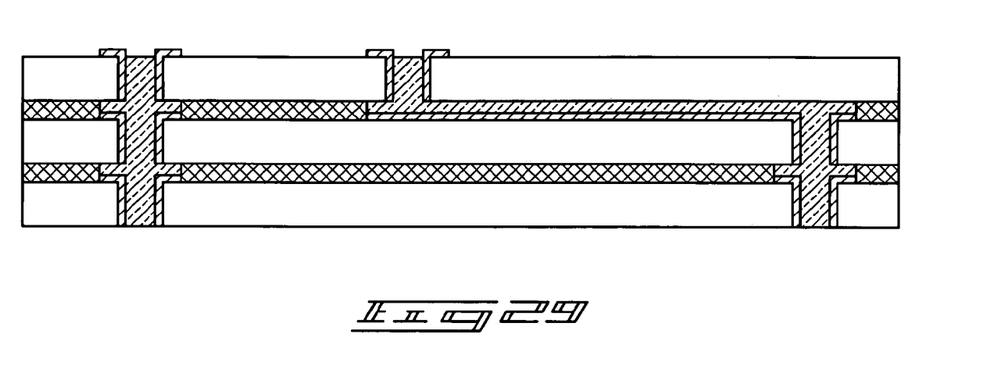
FIG. 29 shows the completed wafer assembly.

The combined three wafers are then placed in a soldering chamber comprising upper and lower halves 20,21 (FIG. 23). The upper half 20 is formed with openings 22 that are coincident with the vias 3 in the first wafer 1 and which connect to a vacuum tunnel 23. The lower half 21 is formed with openings 24 that are coincident with the vias formed in the third wafer and which enable a fluid connection between molten solder 25, provided in a solder pool 26 (FIG. 24). An interposing layer may be provided to protect the wafers from direct contact with the solder. Vacuum is then applied as shown by the arrows in FIG. 25 and solder is drawn from the solder pool 26 through the vias and microchannels in the three wafers until the level of the solder is above the top surface of the first wafer and all vias and all microchannels are filled with molten solder. The solder pool 26 is removed the solder allowed to cool (FIG. 26). The chamber temperature is then increased again to about 230° C. in a local region, in particular the regions where the solder fills openings in the soldering chamber adjacent the wafer stack, which is just sufficient to soften the solder in the openings of the chamber (FIG. 27). The manner in which this is achieved is shown in FIG. 28 which shows in detail the structure of the openings in the upper and lower halves 20, 21 of the soldering chamber. In particular each opening is provided with a heating element 35 formed around the inner surface of the opening and a power supply 36 leading to the heating element 35. The heating element 35 is capable of heating the solder 37 through a thermal conductor 38. This design allows the solder 37 in the localized region of the openings to be softened and to allow the three stacked wafers to be removed from the solder chamber (FIG. 29). The tooling forming the upper and lower halves 20, 21 of the soldering chamber may be provided with a polymer coating the facilitate removal of the completed wafer stack from the soldering chamber.

The soldering chamber 20, 21 is provided with an integral heating means that enables the temperature of the chamber to be controlled between 150° C. and 350° C. such that a range of solder materials can be used including soft solders such as SnPb and hard solders such as SnAgCu and SnAu. It will also be understood that the space between the two halves of the soldering chamber can be varied to accept wafer stack assemblies of different thicknesses and with different numbers of wafer, and different diameter wafers (eg from 4" to 12"). The vacuum can be applied with a pressure differential between outside and inside of from 100-10000 Pa.

The result is a stack of three wafers as shown in FIG. 29 that are bonded together with adhesive, and where the vias and interconnecting microchannels are filled with solder enabling electrical interconnection between the three wafers. Using a solder reflow process with vacuum has the advantage that it is a simple process with low cost, and that it enables the vias and microchannels to be filled with solder with a smaller likelihood of the formation of voids than the prior art. Furthermore, a single process is used to fill all the vias with solder rather than using a repeated solder reflow process that can cause reliability issues. It should also be noted that during the solder filling process the lower part of the soldering chamber serves to keep the wafer stack out of contact with the molten solder other than at the openings through which the molten solder is drawn.

It will be understood that the combination of vertical vias and horizontal microchannels provides for maximum flexibility in the design of a wafer stack and in the provision of different arrangements of electrical interconnections between wafers depending on the requirements of any particular application. Vertical vias and horizontal microchannels can be combined in any suitable way depending on the connection requirements and space limitations and considerations of any particular wafer stack.

Figure 30:
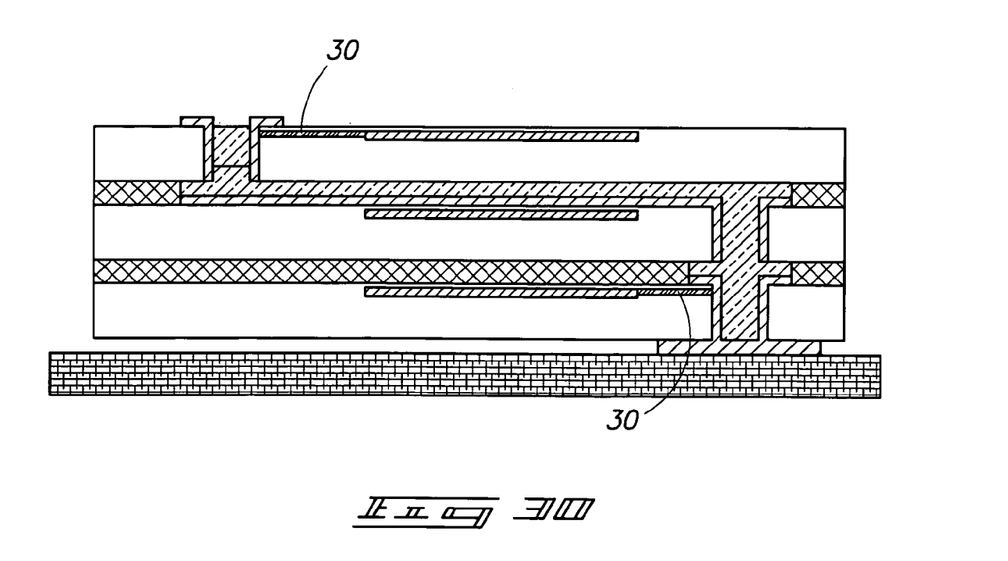
FIG. 30 shows an example of three wafers connected by a combination of vertical TSVs and horizontal microchannels with selective electrical connections of circuits formed on wafers.
Figure 31:
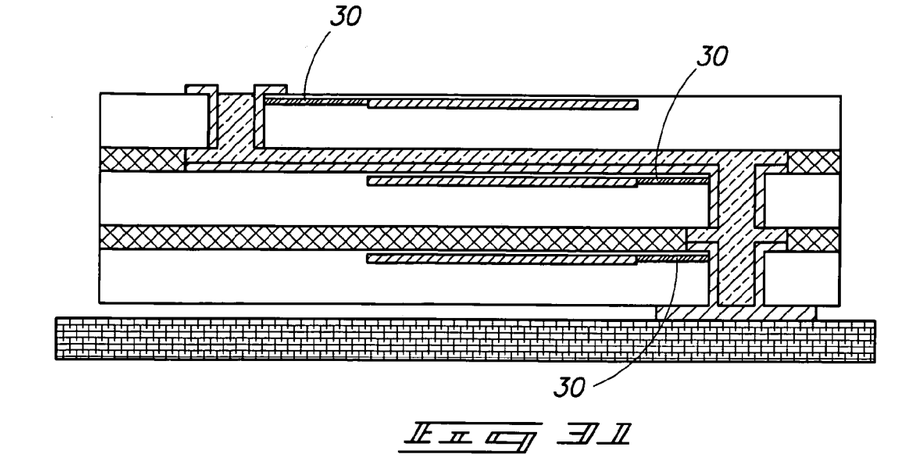
FIG. 31 is the same as FIG. 30 but with all circuits connected.

For example, FIG. 30 shows a stack of three wafers in which the circuits formed on first and third wafers (ie the top and the bottom in the figure) are electrically connected to each other but the second is not. A vertical TSV connects the first wafer to the middle second wafer, and vertical TSVs connect the second wafer to the third wafer. However, the TSVs of the second and third wafers are laterally is disposed relative to the TSV of the first wafer and the connection between the first wafer TSV and the second wafer TSV is made by a lateral microchannel at the junction or interface between the first and second wafers. In the example of FIG. 30 the TSV of the first wafer and the TSV of the third wafer connect to the circuits formed on those wafers by interconnections 30, but the TSV of the second wafer does not connect to the circuit formed on the second wafer which is therefore bypassed. In contrast, the example of FIG. 31 is identical to FIG. 30 except that the circuit on the second wafer is connected to the TSV of the second wafer.

Figure 32:
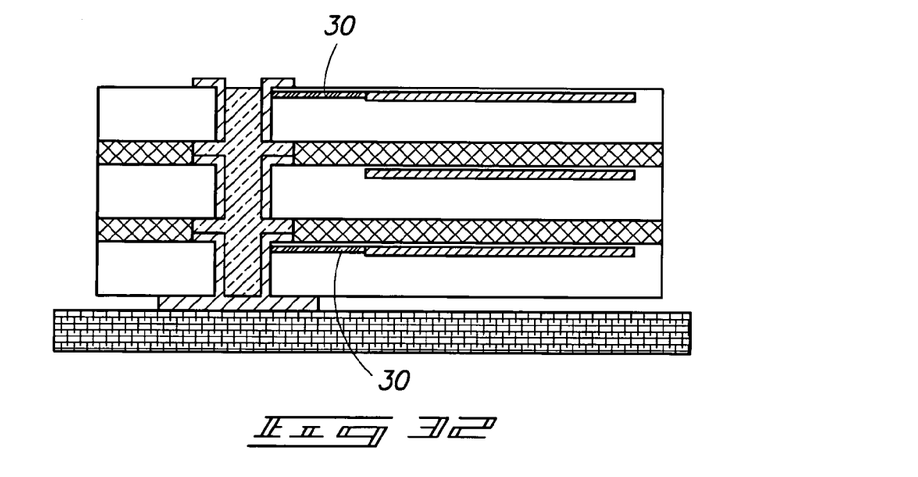
FIG. 32 shows an example of three wafers connected by vertical TSVs alone and with selective electrical connections of circuits formed on wafers.
Figure 33:
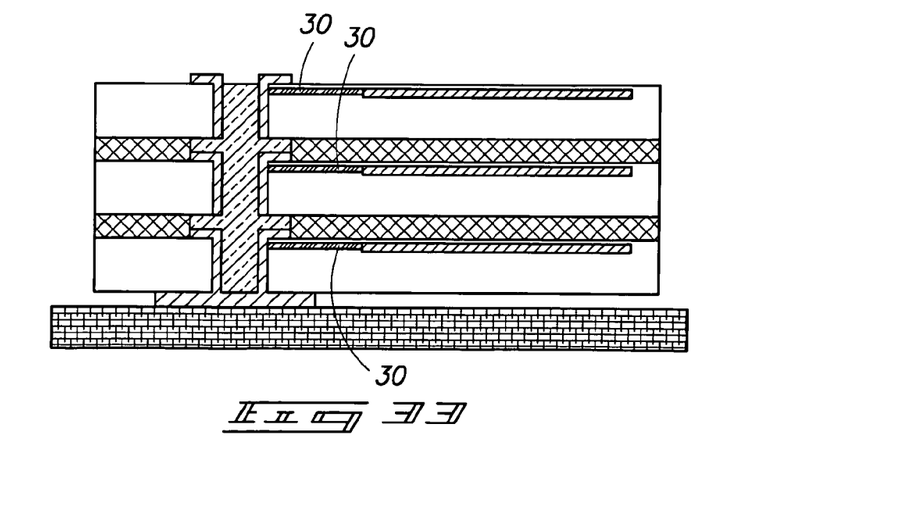
FIG. 33 is the same as FIG. 32 but with all circuits connected.

It will also be understood that where wafers are connected by vertical TSVs only, individual circuits can be selectively connected. For example in FIG. 32 there are shown three wafers connected by vertical TSVs alone with no lateral microchannels. In FIG. 32 only the circuits formed in the first and third wafers connect to the circuits formed on those wafers by interconnections 30, while the circuit formed on the middle wafer does not and is therefore not connected to the first and third wafers. In contrast, in FIG. 33 the same structure is shown except that in this case all three wafers include circuits that are connected to the TSVs and hence to each other.

The invention claimed is:

1. A method of forming a wafer stack comprising the steps of, assembling a plurality of wafers, wherein each said wafers is provided with at least one via and wherein a laterally extending channel is provided at an interface between two wafers connecting a via formed in one of said two wafers with a via formed in the other of said wafers, placing said plurality of wafers in a soldering chamber, and applying a vacuum to a first of said wafers defining a first side of said wafer stack to draw molten solder from a second side of said wafers through said vias and laterally extending channel until said vias and channel are filled with solder.

2. A method as claimed in claim 1 wherein said soldering chamber is provided with a vacuum tunnel that connects to openings that correspond with the openings of said vias formed in the first said wafer, and wherein molten solder is drawn through said vias and channel until it extends into said openings in the soldering chamber.

3. A method as claimed in claim 1 wherein after said molten solder is drawn through said wafer stack said wafer stack is allowed to cool and is then locally re-heated to enable removal of the wafer stack from the soldering chamber.

4. A method as claimed in claim 1 wherein said wafer stack is formed on a wafer holder, and wherein said wafer holder is removed before placing said wafer stack in said soldering chamber.

5. A method as claimed in claim 4 wherein said wafer stack is formed by the steps of (a) depositing a first layer of photoresist on a first wafer and then patterning a first surface of said first layer of photoresist to define vias to be formed in said first wafer, (b) etching openings in said first wafer corresponding to said vias but not extending all the way through said first layer, (c) forming a metal layer on the interior of said openings and on the surface of said first wafer surrounding said openings, (d) fixing said first wafer to a wafer holder such that said first surface of said first wafer faces said wafer holder and a second surface of said wafer faces away from said wafer holder, (e) grinding said second surface of said first wafer until said openings extend all the way through said first wafer and become vias, (f) applying a layer of adhesive to said second surface and patterning said layer of adhesive to remove adhesive at least in the regions of said vias, attaching to said layer of adhesive a second wafer on which the steps of (a) to (c) have been carried out and then carrying out steps (e) and (f) on said second wafer and then repeating steps (a) to (c) and (e) to (f) on subsequent wafers until the wafer stack is complete with step (f) being omitted on the final wafer.

6. A method as claimed in claim 5 wherein in step (f) said adhesive layer is patterned to define a said channel extending from a via in said first wafer to a via in said second wafer.

7. A method of forming a wafer stack comprising the steps of (a) depositing a first layer of photoresist on a first wafer and then patterning a first surface of said first layer of photoresist to define vias to be formed in said first wafer, (b) etching openings in said first wafer corresponding to said vias but not extending all the way through said first layer, (c) forming a metal layer on the interior wall of said openings and on the surface of said first wafer surrounding said openings, (d) fixing said first wafer to a wafer holder such that said first surface of said first wafer faces said wafer holder and a second surface of said wafer faces away from said wafer holder, (e) grinding said second surface of said first wafer until said openings extend all the way through said first wafer and become vias, (f) applying a layer of adhesive to said second surface and patterning said layer of adhesive to remove adhesive at least in the regions of said vias, attaching to said layer of adhesive a second wafer on which the steps of (a) to (c) have been carried out and then carrying out steps (e) and (f) on said second wafer and then repeating steps (a) to (c) and (e) to (f) on subsequent wafers until the wafer stack is complete with step (f) being omitted on the final wafer, wherein step (f) forms a laterally extending channel at an interface between two wafers connecting a via formed in one of said two wafers with a via formed in the other of said wafers.

8. A method as claimed in claim 7 wherein in step (f) said adhesive layer is patterned to define a channel extending from a via in said first wafer to a via in said second wafer.

9. A method of filling vias in a wafer stack with solder comprising the steps of, placing said wafer stack in a soldering chamber at a first temperature, allowing molten solder to fill said vias in said wafer stack, allowing said wafer stack to cool such that said molten solder is allowed to cool and solidify, and then locally heating a part of said soldering chamber to a second temperature lower than said first temperature to enable said wafer stack to be removed from said soldering chamber.

10. A method as claimed in claim 1 wherein at least two vias respectively formed in two adjacent wafers are laterally displaced relative to each other.

11. A method as claimed in claim 7 wherein at least two vias respectively formed in two adjacent wafers are laterally displaced relative to each other.

* * * * *